United States Patent
Sirigu

(10) Patent No.: US 11,175,638 B2
(45) Date of Patent: Nov. 16, 2021

(54) SELF-DIAGNOSTIC ELECTRICAL CIRCUIT

(71) Applicant: OTIS Elevator Company, Farmington, CT (US)

(72) Inventor: Gérard Sirigu, Gien (FR)

(73) Assignee: OTIS ELEVATOR COMPANY, Farmington, CT (US)

(*) Notice: Subject to any disclaimer, the term of this patent is extended or adjusted under 35 U.S.C. 154(b) by 862 days.

(21) Appl. No.: 15/772,278

(22) PCT Filed: Nov. 9, 2015

(86) PCT No.: PCT/IB2015/002246
§ 371 (c)(1),
(2) Date: Apr. 30, 2018

(87) PCT Pub. No.: WO2017/081506
PCT Pub. Date: May 18, 2017

(65) Prior Publication Data
US 2018/0314214 A1    Nov. 1, 2018

(51) Int. Cl.
G05B 9/02         (2006.01)
B66B 5/00         (2006.01)
G01R 31/14        (2006.01)

(52) U.S. Cl.
CPC .............. *G05B 9/02* (2013.01); *B66B 5/0087* (2013.01); *G01R 31/14* (2013.01);
(Continued)

(58) Field of Classification Search
CPC ............ G05B 9/02; G05B 2219/21039; G05B 2219/24008; G05B 2219/24054;
(Continued)

(56) References Cited

U.S. PATENT DOCUMENTS 4,898,263 A    2/1990  Manske et al.
5,487,448 A    1/1996  Schollkopf et al.
(Continued)

FOREIGN PATENT DOCUMENTS

CN    2280892 Y    5/1998
CN    2497276 Y    6/2002
(Continued)

OTHER PUBLICATIONS

International Search Report from the International Searching Authority for International Application No. PCT/IB2015/002246; Date of Completion: Jun. 27, 2016; dated Jul. 5, 2016; 5 Pages.
(Continued)

*Primary Examiner* — Alvaro E Fortich
*Assistant Examiner* — Zannatul Ferdous
(74) *Attorney, Agent, or Firm* — Cantor Colburn LLP

(57) ABSTRACT

A self-diagnostic circuit includes an electrical conductor configured to multiplex, a first switch interposing the electrical conductor, and a first module crossing the first switch. The first module includes a first receptor antenna associated with the conductor on one side of the first switch, a first emitter antenna associated with the conductor on an opposite side of the first switch, and a first interfacing microprocessor. The first interfacing microprocessor is configured to receive no signal from the first receptor antenna when the first switch is open thus generating a first open signal and a first address signal indicative of the first module and outputting the first open signal and the first address signal to the conductor via the first emitter antenna. The first interfacing microprocessor is further configured to receive a first induced frequency signal from the first receptor antenna when the first switch is closed thus generating a first closed signal and the first address signal indicative of the first (Continued)

module and outputting the first closed signal and the first address signal to the conductor via the first emitter antenna.

14 Claims, 1 Drawing Sheet

(52) U.S. Cl.
CPC .............. *G05B 2219/21039* (2013.01); *G05B 2219/24008* (2013.01); *G05B 2219/24054* (2013.01); *G05B 2219/2659* (2013.01)

(58) Field of Classification Search
CPC ........ G05B 2219/2659; G05B 23/0221; G01R 31/14; G01R 31/3835; B66B 5/0087; G01N 2500/10; G01N 33/505
See application file for complete search history.

(56) References Cited

U.S. PATENT DOCUMENTS

| | | | |
|---|---|---|---|
| 5,610,374 A | 3/1997 | Boom et al. | |
| 5,708,416 A | 1/1998 | Zaharia et al. | |
| 6,193,019 B1 | 2/2001 | Sirigu et al. | |
| 6,467,585 B1 | 10/2002 | Gozzo et al. | |
| 7,264,090 B2 | 9/2007 | Vecchiotti et al. | |
| 7,708,118 B2 | 5/2010 | Tyni et al. | |
| 7,905,330 B2 | 3/2011 | Jahkonen | |
| 9,876,355 B2 | 1/2018 | Bennett | |
| 10,346,811 B1* | 7/2019 | Jordan, II | G08B 21/182 |
| 2003/0009715 A1 | 1/2003 | Ricchetti et al. | |
| 2003/0111300 A1 | 6/2003 | Schuster | |
| 2004/0127161 A1 | 7/2004 | Leizerovich et al. | |
| 2006/0282702 A1 | 12/2006 | Bando et al. | |
| 2007/0007087 A1 | 1/2007 | Matsuoka | |
| 2007/0090694 A1 | 4/2007 | Pullmann et al. | |
| 2007/0182255 A1 | 8/2007 | Schneiderheinze et al. | |
| 2012/0031707 A1 | 2/2012 | Ketoviita et al. | |
| 2013/0094559 A1 | 4/2013 | Buchner et al. | |
| 2014/0100675 A1 | 4/2014 | Dold | |
| 2014/0164834 A1 | 6/2014 | Staengler | |
| 2017/0097627 A1* | 4/2017 | Bardin | H01H 3/16 |
| 2021/0101783 A1* | 4/2021 | Roussel | B66B 5/005 |

FOREIGN PATENT DOCUMENTS

| | | |
|---|---|---|
| CN | 201110951 Y | 9/2008 |
| CN | 101849226 A | 9/2010 |
| CN | 102040147 A | 5/2011 |
| CN | 102372222 A | 3/2012 |
| CN | 103378873 A | 10/2013 |
| CN | 103552942 A | 2/2014 |
| CN | 103685612 A | 3/2014 |
| CN | 103832913 A | 6/2014 |
| CN | 203933153 U | 11/2014 |
| CN | 204012751 U | 12/2014 |
| CN | 104570719 A | 4/2015 |
| CN | 104583787 A | 4/2015 |
| CN | 104884121 A | 9/2015 |
| EP | 0940901 A2 | 9/1999 |
| EP | 2658153 A2 | 10/2013 |
| JP | 2006264890 A | 10/2006 |
| JP | 2013085085 A | 5/2013 |
| JP | 2014070987 A | 4/2014 |
| KR | 20000020959 A | 4/2000 |
| WO | 2004035449 A1 | 4/2004 |
| WO | 2008119870 A | 10/2008 |

OTHER PUBLICATIONS

Written Opinion from the International Searching Authority for International Application No. PCT/IB2015/002246; International Filing Date: Nov. 9, 2015; dated Jul. 5, 2016; 7 Pages.
Chinese Office Action for Chinese Application No. 201580084459.7; dated Oct. 28, 2020; 9 Pages.
English Translation of Chinese Office Action for Chinese Application No. 201580084459.7; dated Oct. 28, 2020; 5 Pages.

* cited by examiner

SELF-DIAGNOSTIC ELECTRICAL CIRCUIT

CROSS REFERENCE TO RELATED APPLICATIONS

This application is a National Stage application of PCT/IB2015/002246, filed Nov. 9, 2015, which is incorporated by reference in its entirety herein.

BACKGROUND

The present disclosure relates to electrical circuits, and more particularly to circuits having self-diagnostic capability.

Circuits having daisy-chained switches may be applied to programmable electronic systems in safety related applications (PESSRAL) that may further be applied to elevator system applications amongst a wide variety of other applications. Present circuits having, for example, a plurality of switches configured in series may be difficult to diagnosis if one or more switches fail. Existing self-diagnostics for such circuits require an increase in wiring and/or a duplication in contacts leading to a wide range of complications and expense. Moreover, various government regulations may prevent some self-diagnostic sub-systems from being wired in parallel to the circuit being diagnosed (e.g., PESSRAL applications).

SUMMARY

A self-diagnostic circuit according to one, non-limiting, embodiment of the present disclosure includes an electrical conductor configured to multiplex; a first switch interposing the electrical conductor; and a first module crossing the first switch, and including a first receptor antenna associated with the conductor on one side of the first switch, a first emitter antenna associated with the conductor on an opposite side of the first switch, and a first interfacing microprocessor; and wherein the first interfacing microprocessor is configured to generate a first address signal indicative of the first module, receive no signal from the first receptor antenna when the first switch is open thus generating a first open signal and outputting the first open signal and the first address signal to the conductor via the first emitter antenna, and receive a first induced frequency signal from the receptor antenna when the first switch is closed thus generating a first closed signal and outputting the first closed signal and the first address signal to the conductor via the first emitter antenna.

Additionally to the foregoing embodiment, the circuit includes a second switch interposing the electrical conductor; and a second module respectively crossing the second switch, and including a second receptor antenna associated with the conductor on one side of the second switch, a second emitter antenna associated with the conductor on an opposite side of the second switch, and a second interfacing microprocessor; wherein the second interfacing microprocessor is configured to receive no signal from the second receptor antenna relative to the second switch when the second switch is open and receive as an induced frequency one of the first open and the first closed signals combined with the first address signal, and generate a second open signal and a second address signal indicative of the second module when the second switch is open, and output the first open or first closed signal with the first address signal combined with the second open signal and the second address signal to the conductor via the second emitter antenna; and wherein the second interfacing microprocessor is configured to receive a second induced frequency signal from the second receptor antenna when the second switch is closed and receive as an induced frequency one of the first open and the first closed signals combined with the first address signal, and generate a second closed signal and a second address signal indicative of the second module when the second switch is closed, and output the first open or first closed signal with the first address signal combined with the second closed signal and the second address signal to the conductor via the second emitter antenna.

In the alternative or additionally thereto, in the foregoing embodiment, the first open signal and the first address signal are outputted as one distinctive first output signal, and the first closed signal and the first address signal are outputted as one distinctive second output signal.

In the alternative or additionally thereto, in the foregoing embodiment, the first open signal and the first address signal are outputted as one distinctive first output signal and the first closed signal and the first address signal are outputted as one distinctive second output signal, and wherein the second module is configured to output the first output signal, the second open signal and the second address signal as one distinctive third output signal, wherein the first output signal, the second closed signal and the second address signal as a distinctive fourth output signal, wherein the second output signal, the second open signal and the second address signal as one distinctive fifth output signal, and wherein the second output signal, the second closed signal and the second address signal is one distinctive sixth output signal.

In the alternative or additionally thereto, in the foregoing embodiment, the circuit includes a controller configured to receive the third, fourth, fifth and sixth output signals via the conductor and thereby determine the positioning of the first and second switches.

In the alternative or additionally thereto, in the foregoing embodiment, the controller includes a demultiplexer for retrieving the third, fourth, fifth and sixth output signals.

In the alternative or additionally thereto, in the foregoing embodiment, the first receptor antenna and the first emitter antenna are coiled about the conductor.

In the alternative or additionally thereto, in the foregoing embodiment, the third, fourth, fifth and sixth output signals are time modulated.

In the alternative or additionally thereto, in the foregoing embodiment, the third, fourth, fifth and sixth output signals are frequency modulated.

In the alternative or additionally thereto, in the foregoing embodiment, the first switch is disposed in series with the second switch.

In the alternative or additionally thereto, in the foregoing embodiment, the first switch is disposed parallel to the second switch.

In the alternative or additionally thereto, in the foregoing embodiment, the circuit is at least part of a programmable electronic system in safety related applications.

In the alternative or additionally thereto, in the foregoing embodiment, the first and second modules are configured to generate respective intermittent frequencies facilitating energization of the respective modules while processing the information coming from the previous module.

An elevator system according to another, non-limiting, embodiment includes an electrical conductor configured to multiplex; a first switch interposing the electrical conductor; a first module crossing the first switch, and including a first receptor antenna associated with the conductor on one side of the first switch, a first emitter antenna associated with the conductor on an opposite side of the first switch, and a first interfacing microprocessor, wherein the first interfacing microprocessor is configured to receive no signal from the first receptor antenna when the first switch is open thus generating a first open signal and a first address signal indicative of the first module and outputting the first open signal and the first address signal to the conductor via the first emitter antenna, and wherein the first interfacing microprocessor is configured to receive a first induced frequency signal from the first receptor antenna when the first switch is closed thus generating a first closed signal and the first address signal indicative of the first module and outputting the first closed signal and the first address signal to the conductor via the first emitter antenna; a second switch interposing the electrical conductor; and a second module respectively crossing the second switch, and including a second receptor antenna associated with the conductor on one side of the second switch, a second emitter antenna associated with the conductor on an opposite side of the second switch, and a second interfacing microprocessor, wherein the second interfacing microprocessor is configured to receive no signal from the second receptor antenna relative to the second switch when the second switch is open and receive as an induced frequency one of the first open and the first closed signals combined with the first address signal, and generate a second open signal and a second address signal indicative of the second module when the second switch is open, and output the first open or first closed signal with the first address signal combined with the second open signal and the second address signal to the conductor via the second emitter antenna, and wherein the second interfacing microprocessor is configured to receive a second induced frequency signal from the second receptor antenna when the second switch is closed and receive as an induced frequency one of the first open and the first closed signals combined with the first address signal, and generate a second closed signal and a second address signal indicative of the second module when the second switch is closed, and output the first open or first closed signal with the first address signal combined with the second closed signal and the second address signal to the conductor via the second emitter antenna.

Additionally to the foregoing embodiment, the first and second modules are part of a plurality of modules combined in a daisy chain providing redundant information on respective switch positions, and wherein the daisy chain adds redundancy applied to a PESSRAL.

The foregoing features and elements may be combined in various combinations without exclusivity, unless expressly indicated otherwise. These features and elements as well as the operation thereof will become more apparent in light of the following description and the accompanying drawings. However, it should be understood that the following description and drawings are intended to be exemplary in nature and non-limiting.

BRIEF DESCRIPTION OF THE DRAWINGS

Various features will become apparent to those skilled in the art from the following detailed description of the disclosed non-limiting embodiments. The drawings that accompany the detailed description can be briefly described as follows.

DETAILED DESCRIPTION

Figure 1:
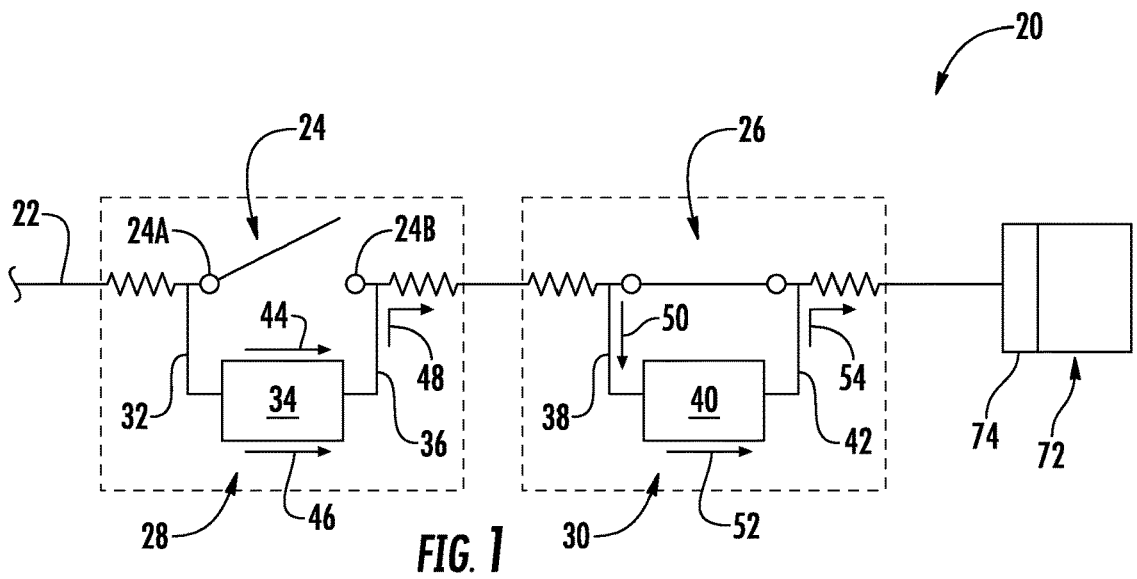
FIG. 1 is a schematic of a self-diagnostic circuit as one exemplary embodiment of the present disclosure.

Referring to FIG. 1, an exemplary embodiment of a self-diagnostic circuit 20 is illustrated. The self-diagnostic circuit 20 may include an electrical conductor 22 (e.g., wire), first and second switches 24, 26 that may interpose the conductor 22 in series, and respective first and second modules 28, 30. The conductor 22 may be an electrical wire adapted to carry a current for any variety of functions when the switches 24, 26, if disposed in series, are both closed. The switches 24, 26 may be only two of a multitude of switches disposed in series, in parallel, or a combination of both (i.e., in series is illustrated). The circuit may be at least part of a programmable electronic system in safety related applications (PESSRAL) that may further be part of an elevator system (not shown) or any variety of other systems that may benefit from the self-diagnostic capability of the circuit 20.

The first module 28 crosses over the first switch 24 (i.e., connects between opposite contacts 24A, 24B of the switch 24), and may include a first receptor antenna 32, an interfacing processor 34 (i.e., a processor with an interfacing circuit) that may be a microprocessor, and a first emitter antenna 36. The first receptor antenna 32 is associated with a first side of the first switch 24 for receiving a signal from the conductor 22. The first emitter antenna 36 is associated with the other side of the first switch for transmitting a signal to the conductor 22. The first receptor antenna 32 may be, at least in-part, coiled about the conductor 22 and electrically connected to an input of the microprocessor 34 and associated interface circuit. The first emitter antenna 36 may be, at least in-part, coiled about the conductor 22 and electrically connected to an output of the microprocessor 34. The first receptor and emitter antennas 32, 36 may not be in physical, electrical, contact with the conductor 22.

The interfacing processor 34 is generally connected to both sides of the switch 24 and may generate an intermittent frequency that facilitates powering of the first module 28 and also processes the information that may be received from the last module. The intermittent frequency path may be directly routed to each module or may be through the respective antennas to power all modules. The intermittent frequency may be linked, or may not be linked, to the open/close signals and address of the first module 28.

Similarly, the second module 30 crosses over the second switch 26 (i.e., connects between opposite contacts of the switch 26), and may include a second receptor antenna 38, an interfacing processor 40 that may be a microprocessor (i.e., processor with an interfacing circuit), and a second emitter antenna 42. The second receptor antenna 38 is associated with a first side of the second switch 26 for receiving a signal from the conductor 22. The second emitter antenna 42 is associated with the other side of the second switch for transmitting a signal to the conductor 22. The second receptor antenna 38 may be, at least in-part, coiled about the conductor 22 and electrically connected to an input of the microprocessor 40. The second emitter antenna 42 may be, at least in-part, coiled about the conductor 22 and electrically connected to an output of the microprocessor 40. The second receptor and emitter antennas 38, 42 may not be in physical, electrical, contact with the conductor 22.

Similar to processor 34, the interfacing processor 40 is generally connected to both sides of the switch 26 and may generate an intermittent frequency that facilitates powering of the second module 30 and also processes the information that may be received from the first module 28.

In operation and with the first switch 24 in an open position, the first processor 34 may receive no input signal (e.g., no induced frequency) from the first receptor antenna 32, and may compare the first receptor antenna signal (i.e., no signal) with the signal from the first emitter antenna 36. Additionally, the modules 28, 30 may perform a self-check by sending individual signals across the respective switches 24, 26. Upon no signal, the processor 34 may generate a first open signal (see arrow 44) and a first address signal (see arrow 46). The signals 44, 46 may generally be combined by the processor 34 and outputted as a distinctive output signal (see arrow 48) (e.g., a wavetrain).

With continued operation and with the second switch 26 in a closed position, the second receptor antenna 38 may receive the output signal 48 of the first processor 34, and an induced closed signal (see arrow 50) indicative of the second switch 26 being closed. The processor 40 may then process the received signals 48, 50, generally combine the signals with a second address signal (see arrow 52) indicative of the second switch 26, and provide an output signal (see arrow 54) indicative of all three signals (i.e., indicating first switch is open and second switch is closed). The signals may, for example, be in the form of a wavetrain. For example, when a switch is closed, the initial wavetrain path is through the respective switch, and then the interfacing processor 40 adds a closed signal and an address signal to the end of the wavetrain.

That is, when a switch 26 is closed, the initial wavetrain path is through the switch 26 and then the interfacing processor 40 will add to the end of the wavetrain a close signal and the respective address signal. When the switch 26 is open, the wavetrain is induced to the receipt antenna 38, processed by the microprocessor 40 and re-injected via the emitter antenna 42 after adding the open signal and respective address signal to the end of the wavetrain.

Figure 2:
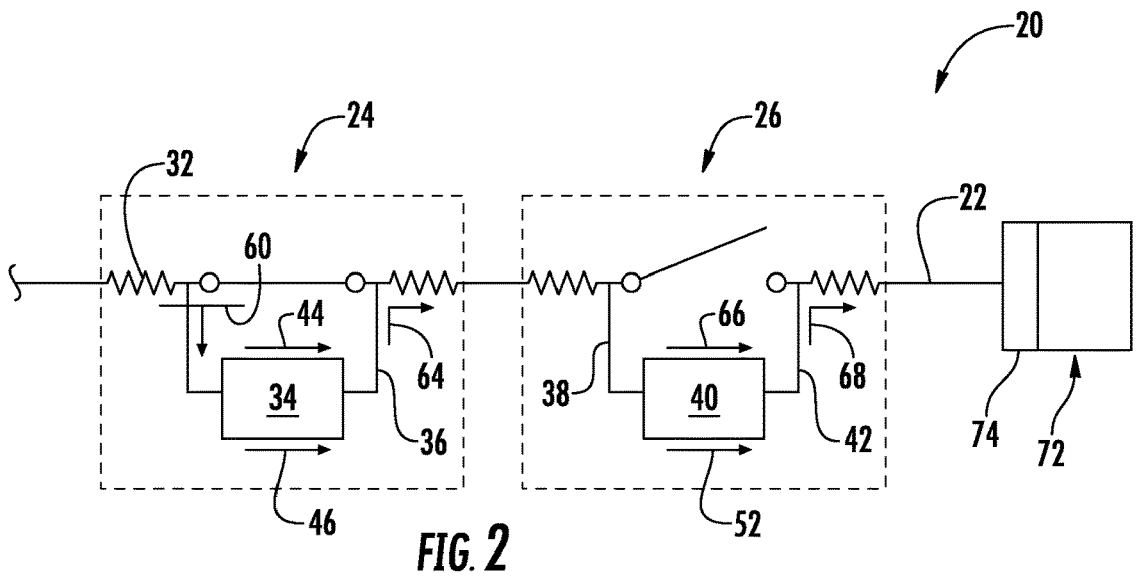
FIG. 2 is a schematic of the self-diagnostic circuit in a second configuration.

Referring to FIG. 2 and in operation with the first switch 24 in a closed position and the second switch 26 in an open position, the first processor 34 may receive an input signal (see arrow 60) (e.g., induced frequency) from the first receptor antenna 32 indicative of the switch 24 being closed (i.e. the self-check previously described). Upon receipt of signal 60, the processor 34 may generate a first closed signal (see arrow 44) and the first address signal (see arrow 46). The signals 44, 46 may generally be combined by the processor 34 and outputted as a distinctive output signal (see arrow 64) (i.e., wavetrain).

With continued operation and with the second switch 26 in an open position, the second receptor antenna 38 may receive the output signal 64 of the first processor 34, and no other signal relative to the second switch, thus indicative of the second switch 26 being open. The processor 40 may then process the received signal 64 and generate an open signal 66 indicative of no input signal relative to the second switch 26. The processor 40 may generally combine the signals 64, 66, 52 and output a distinctive output signal (see arrow 68) indicative of all three signals (i.e., indicating first switch is closed and second switch is open).

Figure 3:
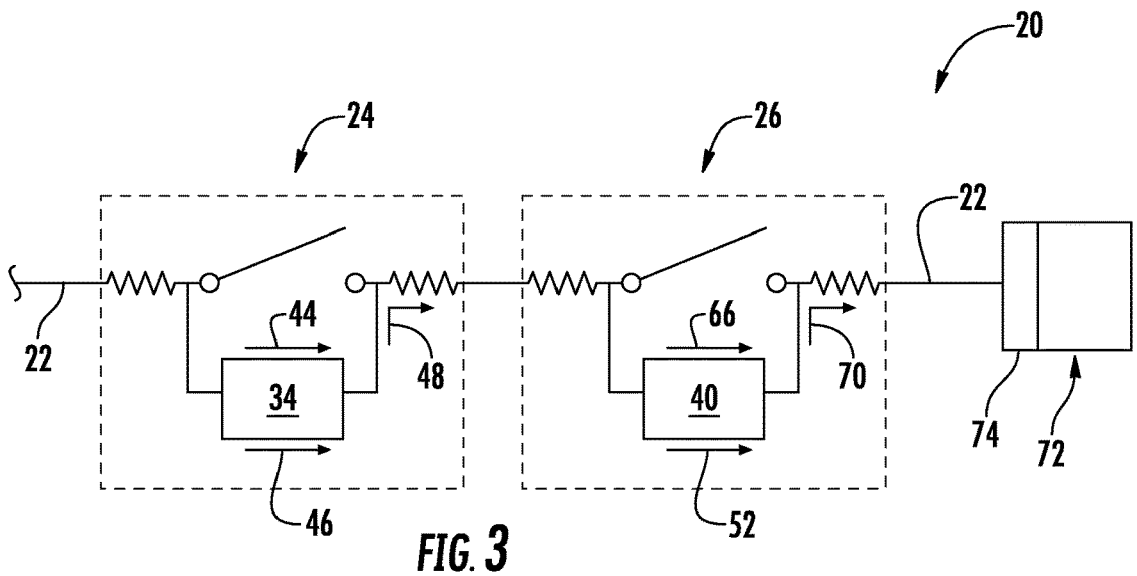
FIG. 3 is a schematic of the self-diagnostic circuit in a third configuration.

Referring to FIG. 3 and in operation with both switches 24, 26 in open positions, the first processor 34 may receive no input signal (e.g., no induced frequency) from the first receptor antenna 32. Upon no signal, the processor 34 may generate the first open signal 44 and the first address signal 46. The signals 44, 46 may generally be combined by the processor 34 and outputted as the distinctive output signal 48.

With continued operation and with the second switch 26 in the open position, the second receptor antenna 38 may receive the output signal 48 of the first processor 34, and no other signal relative to the second switch, thus indicative of the second switch 26 being open. The processor 40 may then process the received signal 48 and generate the open signal 66 indicative of no input signal relative to the second switch 26. The processor 40 may generally combine the signals 48, 66, 52 and output a distinctive output signal (see arrow 70) indicative of all three signals (i.e., indicating first and second switches are open).

The self-diagnostic circuit 20 may further include a controller 72 that is configured to receive any combination of signals including output signals 54, 68, 70 previously described. The controller 72 may be preprogrammed to identify the various output signals and provide notification of which switch, for example, is inoperative and/or not in the correct position. The address signals 46, 52 may be specific codes or frequencies pre-assigned to a specific switch. The code may modulate with time or frequency (i.e. multi-tasking). It is further contemplated and understood that controller 72 may include a demultiplexer 74 and the circuit may be configured to multiplex any one or more of the signals previously described across any one or more portions of the conductor 22.

It is further contemplated and understood that the first and second modules are part of a plurality of modules configured in a daisy chain that may provide redundant information relative to switch positioning status. This information may be used as a redundancy applied to safety applications (e.g., PESSRAL).

While the present disclosure is described with reference to exemplary embodiments, it will be understood by those skilled in the art that various changes may be made and equivalents may be substituted without departing from the spirit and scope of the present disclosure. In addition, various modifications may be applied to adapt the teachings of the present disclosure to particular situations, applications, and/or materials, without departing from the essential scope thereof. The present disclosure is thus not limited to the particular examples disclosed herein, but includes all embodiments falling within the scope of the appended claims.

What is claimed is:

1. A self-diagnostic circuit comprising:
   an electrical conductor configured to multiplex;
   a first switch interposing the electrical conductor; and
   a first module crossing the first switch, and including a first receptor antenna associated with the conductor on one side of the first switch, a first emitter antenna associated with the conductor on an opposite side of the first switch, and a first interfacing microprocessor; and
   wherein the first interfacing microprocessor is configured to generate a first address signal indicative of the first module, receive no signal from the first receptor antenna when the first switch is open thus generating a first open signal and outputting the first open signal and the first address signal to the conductor via the first emitter antenna, and receive a first induced frequency signal from the receptor antenna when the first switch is closed thus generating a first closed signal and outputting the first closed signal and the first address signal to the conductor via the first emitter antenna;
   a second switch interposing the electrical conductor; and
   a second module respectively crossing the second switch, and including a second receptor antenna associated with the conductor on one side of the second switch, a second emitter antenna associated with the conductor on an opposite side of the second switch, and a second interfacing microprocessor;

wherein the second interfacing microprocessor is configured to receive no signal from the second receptor antenna relative to the second switch when the second switch is open and receive as an induced frequency one of the first open and the first closed signals combined with the first address signal, and generate a second open signal and a second address signal indicative of the second module when the second switch is open, and output the first open or first closed signal with the first address signal combined with the second open signal and the second address signal to the conductor via the second emitter antenna; and wherein the second interfacing microprocessor is configured to receive a second induced frequency signal from the second receptor antenna when the second switch is closed and receive as an induced frequency one of the first open and the first closed signals combined with the first address signal, and generate a second closed signal and a second address signal indicative of the second module when the second switch is closed, and output the first open or first closed signal with the first address signal combined with the second closed signal and the second address signal to the conductor via the second emitter antenna.

2. The self-diagnostic circuit set forth in claim 1, wherein the first open signal and the first address signal are outputted as one distinctive first output signal, and the first closed signal and the first address signal are outputted as one distinctive second output signal.

3. The self-diagnostic circuit set forth in claim 2, wherein the first open signal and the first address signal are outputted as one distinctive first output signal and the first closed signal and the first address signal are outputted as one distinctive second output signal, and wherein the second module is configured to output the first output signal, the second open signal and the second address signal as one distinctive third output signal, wherein the first output signal, the second closed signal and the second address signal as a distinctive fourth output signal, wherein the second output signal, the second open signal and the second address signal as one distinctive fifth output signal, and wherein the second output signal, the second closed signal and the second address signal is one distinctive sixth output signal.

4. The self-diagnostic circuit set forth in claim 3 further comprising:
a controller configured to receive the third, fourth, fifth and sixth output signals via the conductor and thereby determine the positioning of the first and second switches.

5. The self-diagnostic circuit set forth in claim 4, wherein the controller includes a demultiplexer for retrieving the third, fourth, fifth and sixth output signals.

6. The self-diagnostic circuit set forth in claim 1, wherein the first receptor antenna and the first emitter antenna are coiled about the conductor.

7. The self-diagnostic circuit set forth in claim 5, wherein the third, fourth, fifth and sixth output signals are time modulated.

8. The self-diagnostic circuit set forth in claim 5, wherein the third, fourth, fifth and sixth output signals are frequency modulated.

9. The self-diagnostic circuit set forth in claim 1, wherein the first switch is disposed in series with the second switch.

10. The self-diagnostic circuit set forth in claim 1, wherein the first switch is disposed parallel to the second switch.

11. The self-diagnostic circuit set forth in claim 1, wherein the circuit is at least part of a programmable electronic system in safety related applications.

12. The self-diagnostic circuit set forth in claim 11, wherein the first and second modules are configured to generate respective intermittent frequencies facilitating energization of the respective modules while processing the information coming from the previous module.

13. An elevator system comprising:
an electrical conductor configured to multiplex;
a first switch interposing the electrical conductor;
a first module crossing the first switch, and including a first receptor antenna associated with the conductor on one side of the first switch, a first emitter antenna associated with the conductor on an opposite side of the first switch, and a first interfacing microprocessor, wherein the first interfacing microprocessor is configured to receive no signal from the first receptor antenna when the first switch is open thus generating a first open signal and a first address signal indicative of the first module and outputting the first open signal and the first address signal to the conductor via the first emitter antenna, and wherein the first interfacing microprocessor is configured to receive a first induced frequency signal from the first receptor antenna when the first switch is closed thus generating a first closed signal and the first address signal indicative of the first module and outputting the first closed signal and the first address signal to the conductor via the first emitter antenna;
a second switch interposing the electrical conductor; and
a second module respectively crossing the second switch, and including a second receptor antenna associated with the conductor on one side of the second switch, a second emitter antenna associated with the conductor on an opposite side of the second switch, and a second interfacing microprocessor, wherein the second interfacing microprocessor is configured to receive no signal from the second receptor antenna relative to the second switch when the second switch is open and receive as an induced frequency one of the first open and the first closed signals combined with the first address signal, and generate a second open signal and a second address signal indicative of the second module when the second switch is open, and output the first open or first closed signal with the first address signal combined with the second open signal and the second address signal to the conductor via the second emitter antenna, and wherein the second interfacing microprocessor is configured to receive a second induced frequency signal from the second receptor antenna when the second switch is closed and receive as an induced frequency one of the first open and the first closed signals combined with the first address signal, and generate a second closed signal and a second address signal indicative of the second module when the second switch is closed, and output the first open or first closed signal with the first address signal combined with the second closed signal and the second address signal to the conductor via the second emitter antenna.

14. The elevator system set forth in claim 13, wherein the first and second modules are part of a plurality of modules combined in a daisy chain providing redundant information on respective switch positions, and wherein the daisy chain adds redundancy applied to a Programmable Electronic Systems in Safety Related Applications (PESSRAL).

* * * * *